United States Patent [19]
Wei et al.

[11] Patent Number: 5,449,639
[45] Date of Patent: Sep. 12, 1995

[54] DISPOSABLE METAL ANTI-REFLECTION COATING PROCESS USED TOGETHER WITH METAL DRY/WET ETCH

[75] Inventors: John C. Wei, Taipei; Kuo-Chin Hsu; An-Min Chiang, both of Hsin-chu, all of Taiwan

[73] Assignee: Taiwan Semiconductor Manufacturing Company Ltd., Hsinchu, Taiwan

[21] Appl. No.: 328,119

[22] Filed: Oct. 24, 1994

[51] Int. Cl.$^6$ .................... H01L 21/28; H01L 21/302
[52] U.S. Cl. .................................. 437/187; 437/190; 437/192; 437/194; 437/195
[58] Field of Search ............... 437/187, 190, 192, 194, 437/195

[56] References Cited
U.S. PATENT DOCUMENTS

| | | | |
|---|---|---|---|
| 5,017,513 | 5/1991 | Takeuchi | 437/228 |
| 5,126,289 | 6/1992 | Ziger | 437/231 |
| 5,356,836 | 10/1994 | Chen et al. | 437/195 |
| 5,393,703 | 2/1995 | Olowolote | 437/192 |

*Primary Examiner*—George Fourson
*Assistant Examiner*—Thomas G. Bilodeau
*Attorney, Agent, or Firm*—George O. Saile

[57] ABSTRACT

A new method of metal etching using a disposable metal antireflective coating process along with metal dry/wet etching is described. An insulating layer is provided over semiconductor device structures in and on a semiconductor substrate. Openings are made through the insulating layer to the semiconductor substrate and to the semiconductor device structures to be contacted. A barrier metal layer is deposited conformally over the insulating layer and within the openings. A metal layer is deposited over the barrier metal layer. The metal layer is covered with an antireflective coating. A layer of photoresist is coated onto the substrate and patterned to provide a photoresist mask. The antireflective coating, the metal layer and a portion of the barrier metal layer are etched away where the layers are not covered by the photoresist mask. The photoresist mask is removed. The remaining barrier metal layer not covered by the patterned metal layer is etched away whereby all the remaining antireflective coating is also removed completing the metal patterning in the fabrication of the integrated circuit.

24 Claims, 7 Drawing Sheets

DISPOSABLE METAL ANTI-REFLECTION COATING PROCESS USED TOGETHER WITH METAL DRY/WET ETCH

BACKGROUND OF THE INVENTION (1) Field of the Invention

The invention relates to the fabrication of integrated circuit devices, and more particularly, to a method of forming contacts without metal thinning and pitting in the fabrication of integrated circuits.

(2) Description of the Prior Art

In metal dry/wet etching processes, aluminum thinning and pitting are major issues. When the metal pitch is scaled down and the topography becomes more variable, metal notching becomes a serious problem and can affect the reliability of the integrated circuit.

Figure 1:
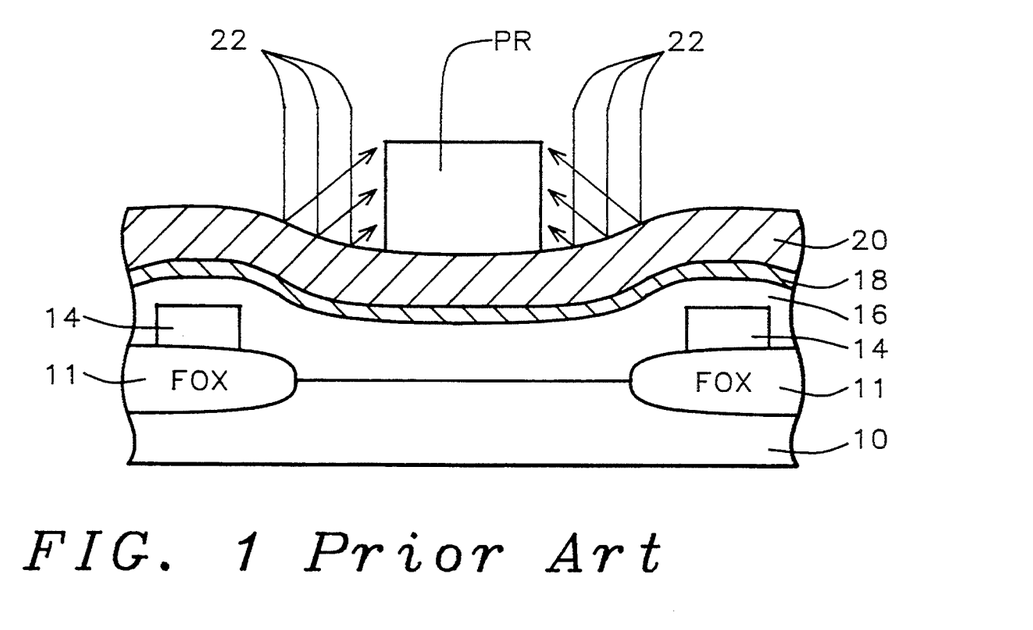
FIGS. 1 and 3 schematically illustrate in cross-sectional representation the notching problem of the prior art.
Figure 2:
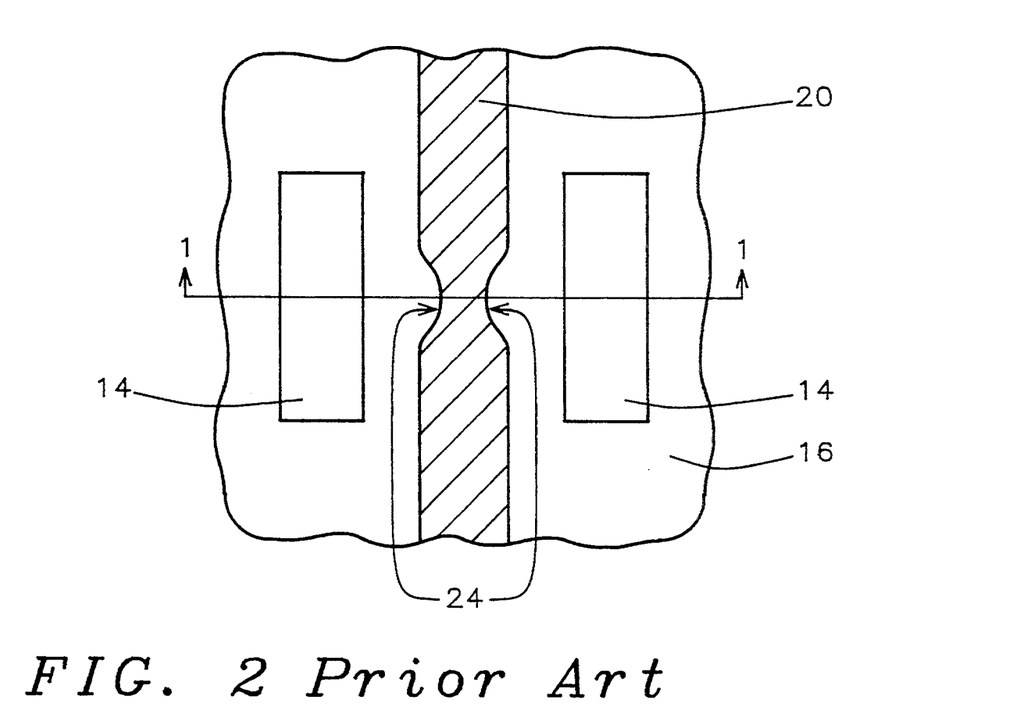
FIGS. 2 and 4 schematically illustrate in top plan view the notching problem of the prior art.

Referring to FIG. 1, there is shown a partially completed integrated circuit. Field OXide regions 11 have been formed in and on a semiconductor substrate 10. Polysilicon or polycide gate electrodes 14 have been formed. A dielectric layer 16, such as borophosphosilicate glass (BPSG) covers the gate electrodes. A barrier metal layer 18 is coated over the dielectric layer. Metal layer 20, typically aluminum, is deposited over the barrier metal layer 18. A layer of photoresist is coated over the metal layer 20 and patterned to form a mask. Because of the highly reflective surface of the metal layer 20, light rays 22 are reflected onto the photoresist layer causing overexposure of portions of the layer. The resulting photoresist mask has a notch in it. Therefore, when the metal is patterned according to the photoresist mask and etched, a metal notch 24 will result, as shown in top view in FIG. 2.

Figure 3:
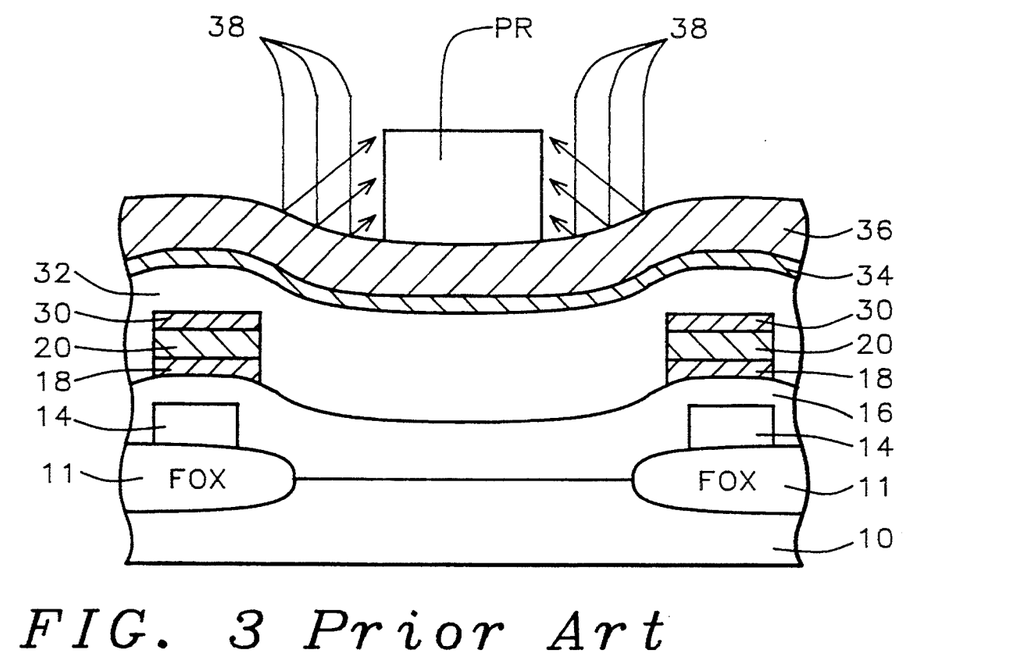
Figure 4:
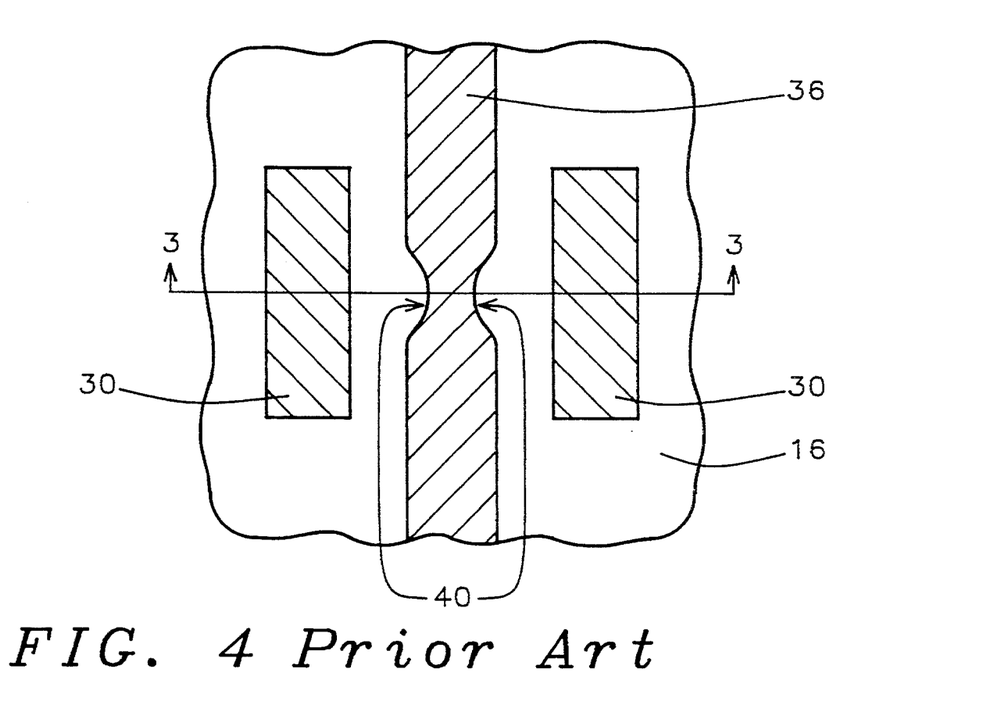

FIG. 3 illustrates the notching problem occurring in the second metal layer. FIG. 3 illustrates the same partially completed integrated circuit as in FIG. 1 wherein an antireflective coating 30 has been deposited over the first metal layer 20. Intermetal dielectric layer 32 covers the patterned first metal layer. Barrier metal layer 34 is deposited followed by second metal layer 36. A layer of photoresist is coated over the metal layer 36 and patterned to form a mask. Because of the highly reflective surface of the metal layer 36, light rays 38 are reflected onto the photoresist layer causing overexposure of portions of the layer. The resulting photoresist mask has a notch in it. Therefore, when the metal is patterned according to the photoresist mask and etched, a metal notch 40 will result, as shown in top view in FIG. 4. It is undesirable to employ an antireflective coating on the topmost metal layer because an undesired polymer is easily formed on the sidewalls of the via hole and some of the thickness of the topmost metal layer may be lost during stripping of the antireflective coating. It would be necessary to modify the etching process to completely remove an antireflective coating.

Figure 5:
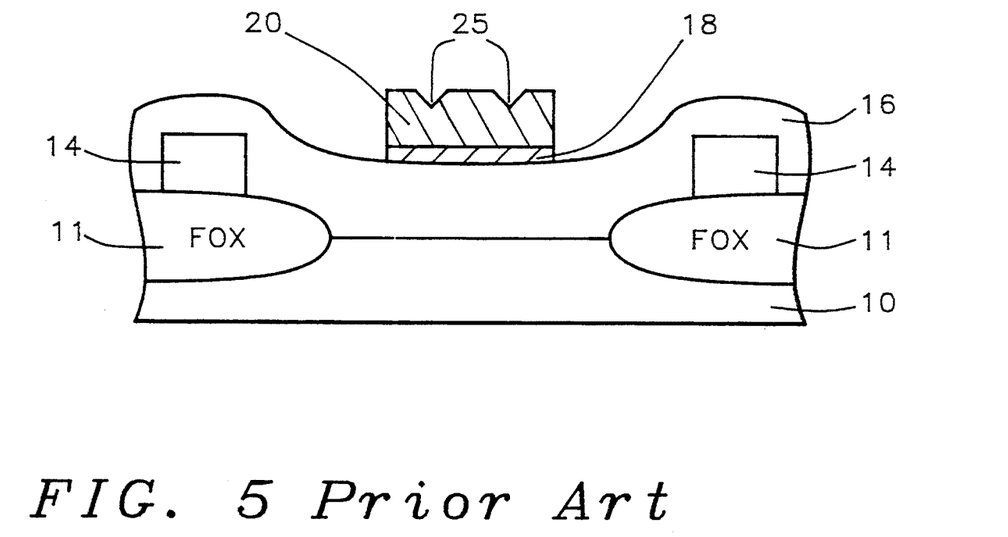
FIG. 5 schematically illustrates in cross-sectional representation the pitting problem of the prior art.

A further problem with the prior art in metal etching is illustrated in FIG. 5. The partially completed integrated circuit of FIG. 1 is shown after metal etching and after removal of the photoresist mask. Pits 25 appear on the surface of the patterned metal layer 20. These pits are the result of the chemical reaction between water and the metal during wet etching, especially if the metal is an aluminum copper alloy. The pitting problem is worst in the bonding pad area.

U.S. Pat. No. 5,126,289 to Ziger describes a method of coating the metal to be patterned with an organic antireflective coating and removing both the antireflective coating and the metal with a plasma etch. U.S. Pat. No. 5,017,513 to Takeuchi describes a method for using an organic layer mask pattern over a metal film.

SUMMARY OF THE INVENTION

A principal object of the present invention is to provide an effective and very manufacturable method of providing metal etching without notching and pitting of the metal layer.

A further object of the invention is to provide a method for using an antireflective coating that will be completely removed after metal etching.

In accordance with the object of this invention a new method of metal etching using a disposable metal antireflective coating process along with metal dry/wet etching is achieved. An insulating layer is provided over semiconductor device structures in and on a semiconductor substrate. Openings are made through the insulating layer to the semiconductor substrate and to the semiconductor device structures to be contacted. A barrier metal layer is deposited conformally over the insulating layer and within the openings. A metal layer is deposited over the barrier metal layer. The metal layer is covered with an antireflective coating. A layer of photoresist is coated onto the substrate and patterned to provide a photoresist mask. The antireflective coating, the metal layer and a portion of the barrier metal layer are etched away where the layers are not covered by the photoresist mask. The photoresist mask is removed. The remaining barrier metal layer not covered by the patterned metal layer is etched away whereby all the remaining antireflective coating is also removed completing the metal patterning in the fabrication of the integrated circuit.

BRIEF DESCRIPTION OF THE DRAWINGS

In the accompanying drawings forming a material part of this description, there is shown.

DESCRIPTION OF THE PREFERRED EMBODIMENTS

Figure 6:
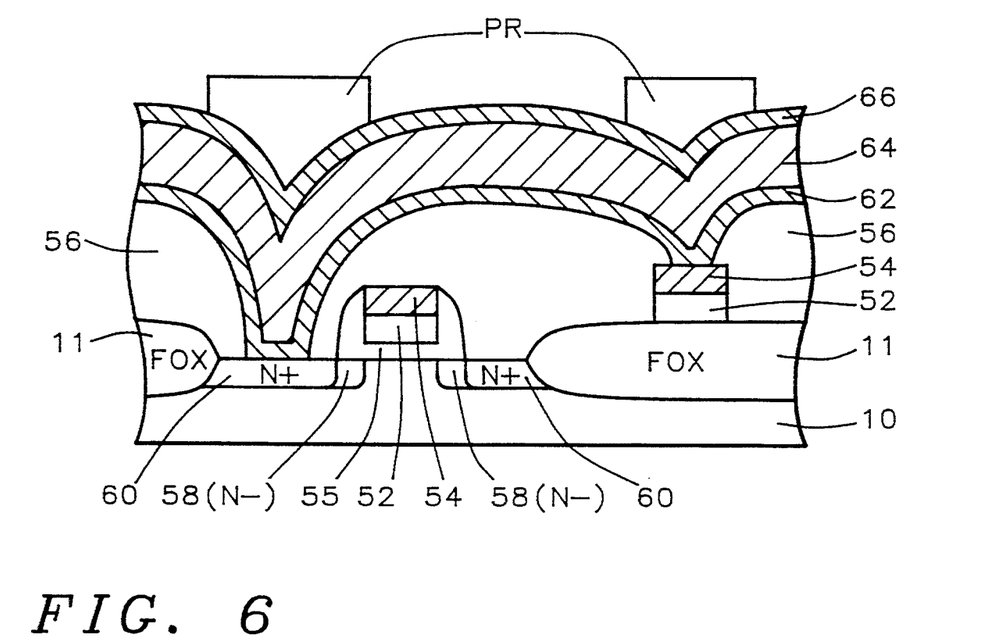
FIGS. 6 through 9 schematically illustrate in cross-sectional representation one preferred embodiment of the present invention.

The first preferred embodiment of the present invention will be described with reference to FIGS. 6 through 9. In this embodiment, a metal to contact overlap is required. Referring now more particularly to FIG. 6, there is shown a portion of a partially completed integrated circuit consisting of a semiconductor substrate 10, preferably composed of monocrystalline silicon. Field OXide regions 11 are formed as is conventional in the art in and on the semiconductor substrate. Semiconductor device structures such as gate electrodes are formed, for example, from a layer of polysilicon 52 topped with a polycide layer 54 composed of tungsten silicide or titanium silicide or the like. Lightly doped drain regions 58 and source and drain regions 60 are formed as is conventional in the art. A thick insulating layer 62 is blanket deposited over the semiconductor device structures. This layer may be composed of borophosphosilicate glass (BPSG), phosphosilicate glass (PSG), silicon dioxide, or the like.

Openings are made through the insulating layer to the semiconductor device structures or to the semiconductor substrate where contacts are to be made. A barrier metal layer 62 is conformally deposited over the insulating layer and within the contact openings. The barrier metal layer may be a single layer of titanium with a thickness of between about 1000 to 1450 Angstroms or it may be composed of a first layer of titanium with a thickness of between about 400 to 500 Angstroms and a second layer of wither titanium tungsten or titanium nitride with a thickness of between about 1000 to 1400 Angstroms.

Next, a metal layer 64 is sputter deposited over the barrier metal layer. The metal layer is typically aluminum or an aluminum alloy such as AlSi, or AlSiCu. The key disposable antireflective coating method of the invention will now be described. An antireflective coating (ARC) layer 66 is deposited over the metal layer by sputtering. The ARC must etch faster than the barrier layer; it is typically thinner than the barrier layer. The ARC must be either titanium nitride, titanium tungsten, or titanium with a thickness of between about 200 to 500 Angstroms. Titanium nitride is preferred because it has the lowest reflectivity of the group. Amorphous silicon and various polymers with dyes which have been used as antireflective coatings cannot be used in the process of the present invention because amorphous silicon and dye resist cannot be removed by wet metal etching.

Figure 7:
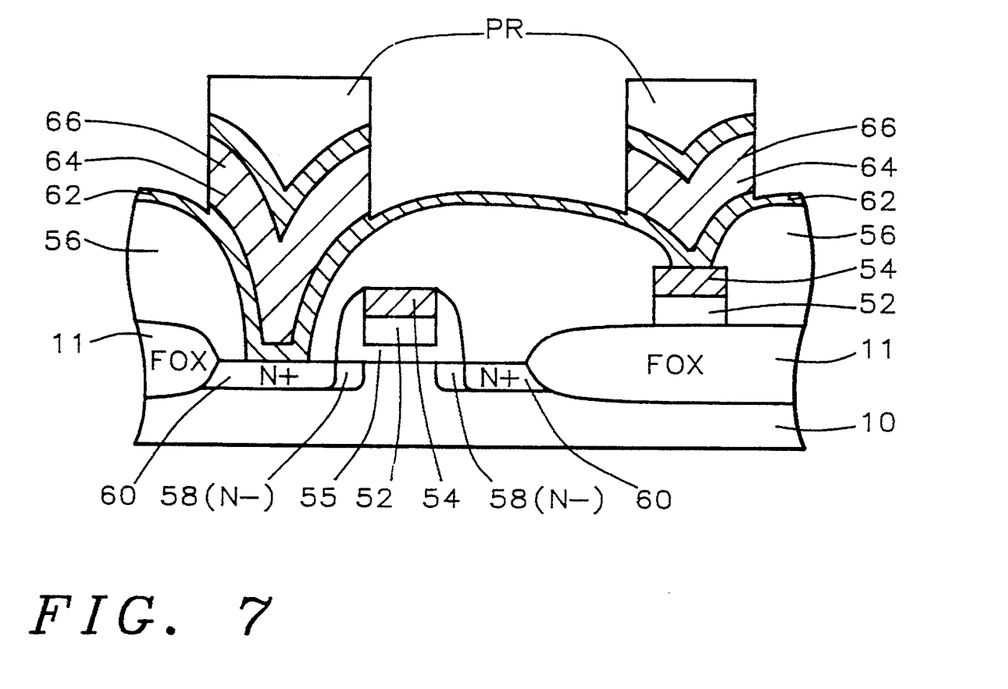
Figure 8:
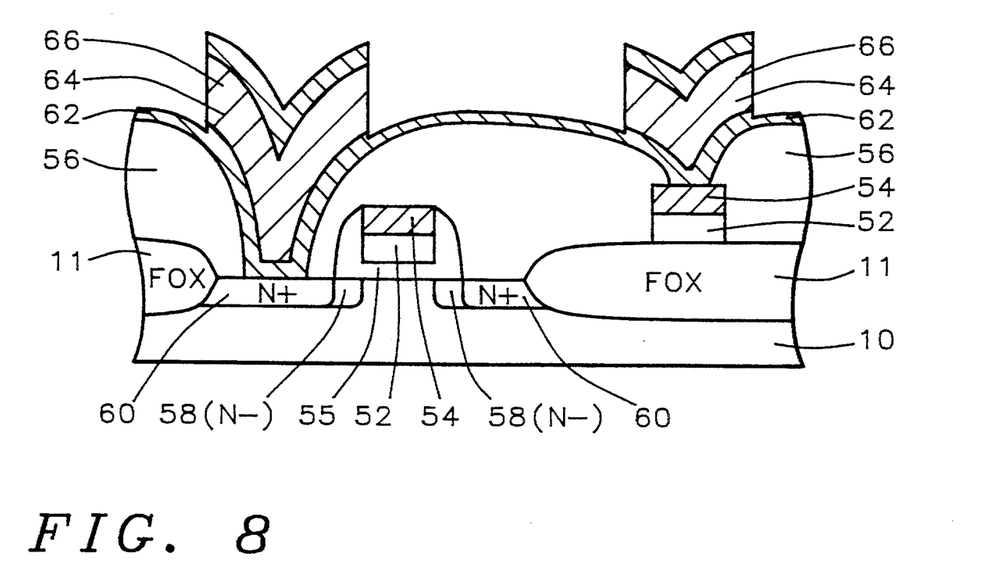

A layer of photoresist is coated over the substrate and patterned to provide a photoresist mask. Referring now to FIG. 7, the antireflective coating, the metal layer, and a portion of the barrier metal layer not covered by the photoresist mask are etched away using a dry etch. The antireflective coating will prevent the metal notching problem of the prior art. FIG. 8 shows the substrate after the photoresist mask has been removed. The ARC also prevents the pitting of the metal layer 64 during photoresist stripping.

Figure 9:
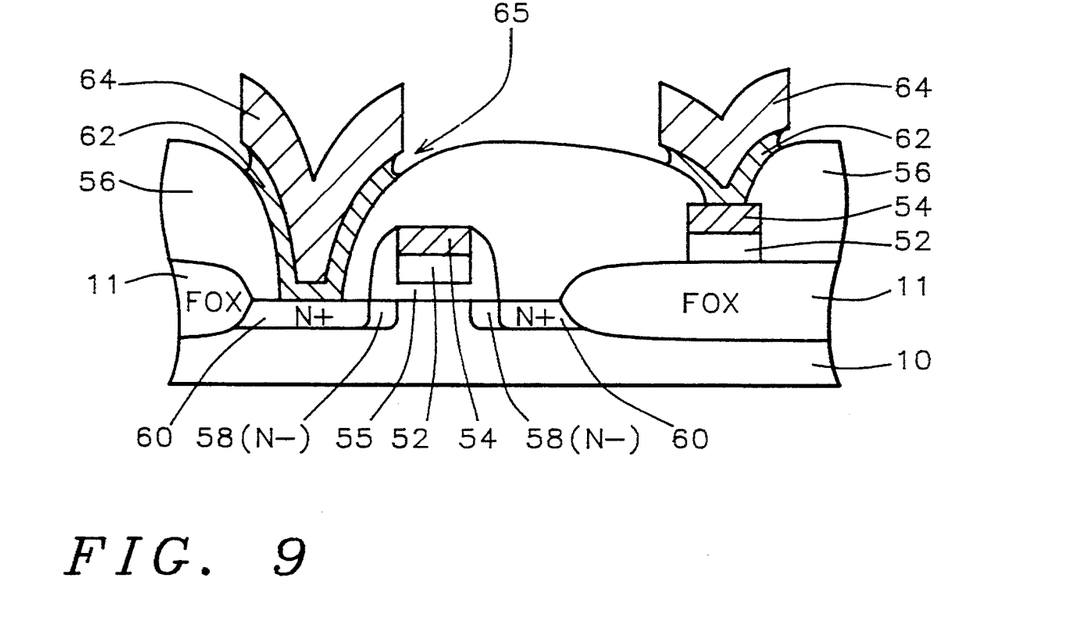

Referring now to FIG. 9, a wet metal etch is used to remove the portion of the barrier metal layer 62 not covered by the metal layer 64. During this wet etch, the remaining antireflective coating 66 is also removed. The wet etch is a solution of hydrogen peroxide, ammonia, and water. The etching solution is chosen so that a high selectivity exists between the barrier metal or the antireflective coating layer and the metal layer. The etch rate must be slow enough so as not to cause serious undercutting of the barrier layer. An undercutting 65 of the barrier metal layer can be seen in FIG. 9. The undercutting of both sides should be less than about 30%.

Because the antireflective coating covers the metal layer 64 and is etched away as the remaining barrier layer 62 is etched away, the metal layer is protected from prolonged exposure to water during the etching process. Therefore, the metal notching problem of the prior art, shown in FIG. 5, does not exist here. Since the ARC is completely removed, the problem of conducting pad etch and wire bonding is not an issue. That is, because the antiflective coating is removed in advance, there is no need for an additional dry etch after pad or via etching.

Figure 10:
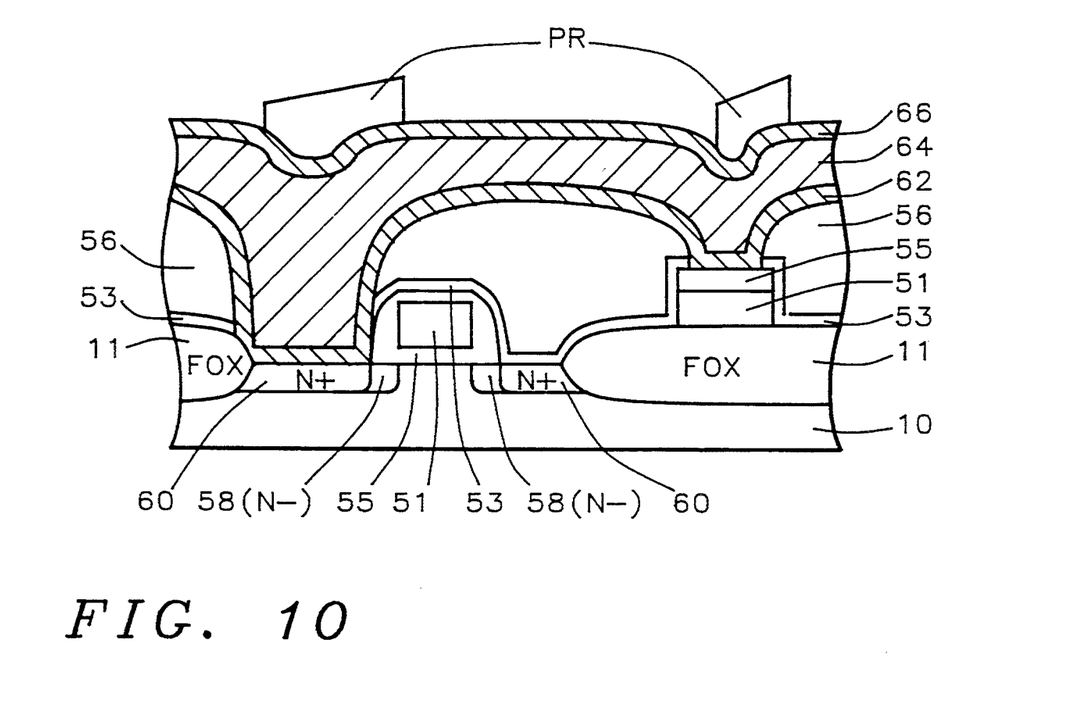
FIGS. 10 through 13 schematically illustrate in cross-sectional representation a second preferred embodiment of the present invention.

The second preferred embodiment of the present invention, a self-aligned contact, will be described with reference to FIGS. 10 through 13. Referring now more particularly to FIG. 10, there is shown a portion of a partially completed integrated circuit consisting of a semiconductor substrate 10, preferably composed of monocrystalline silicon. Field OXide regions 11 are formed as is conventional in the art in and on the semiconductor substrate. Semiconductor device structures such as gate electrodes are formed, for example, from a layer of polysilicon or polycide 51. An oxide layer 55 is formed over the gate electrode or as spacers on its sidewalls. A layer of silicon nitride 53 may be deposited conformally over the gate electrodes. Lightly doped drain regions 58 and source and drain regions 60 are formed as is conventional in the art. A thick insulating layer 56 is blanket deposited over the semiconductor device structures. This layer may be composed of borophosphosilicate glass (BPSG), phosphosilicate glass (PSG), silicon dioxide, or the like.

Openings are made through the insulating layer to the semiconductor device structures or to the semiconductor substrate where contacts are to be made. A barrier metal layer 62 is conformally deposited over the insulating layer and within the contact openings. The barrier metal layer may be a single layer of titanium or a first layer of titanium and a second layer of either titanium tungsten or titanium nitride, as above.

Next, a metal layer 64 is sputter deposited over the barrier metal layer. The metal layer is typically aluminum or an aluminum alloy such as AlSi, or AlSiCu. The key disposable antireflective coating method of the invention is the same as described for the first embodiment. The antireflective coating (ARC) layer 66 is deposited over the metal layer by sputtering. The ARC must etch faster than the barrier layer; it is typically thinner than the barrier layer. The ARC must be either titanium nitride, titanium tungsten, or titanium with a thickness of between about 200 to 500 Angstroms. Titanium nitride is preferred because it has the lowest reflectivity of the group.

Figure 11:
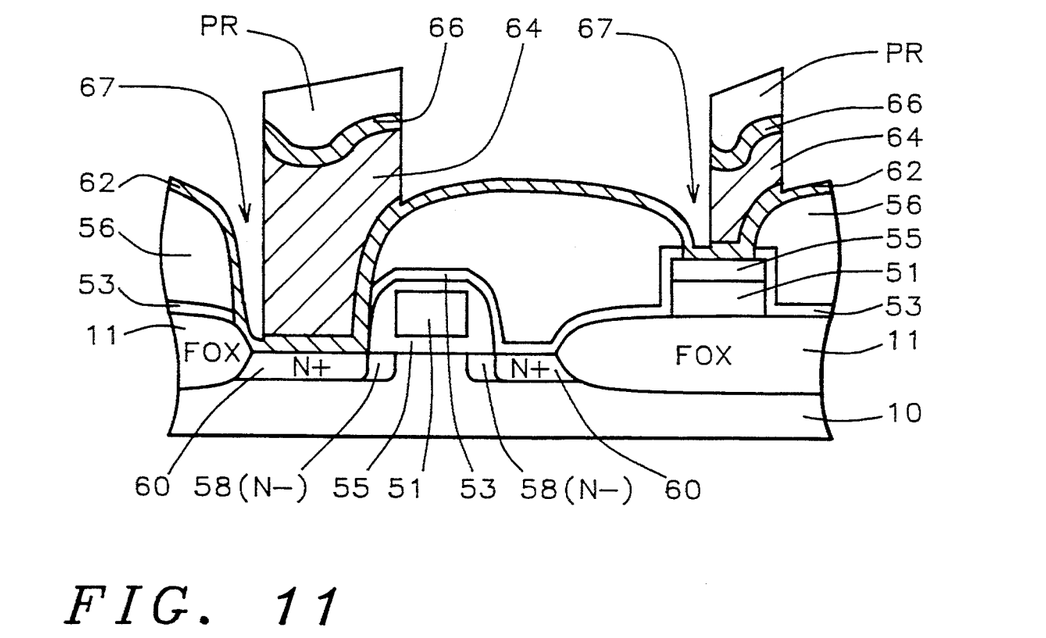
Figure 12:
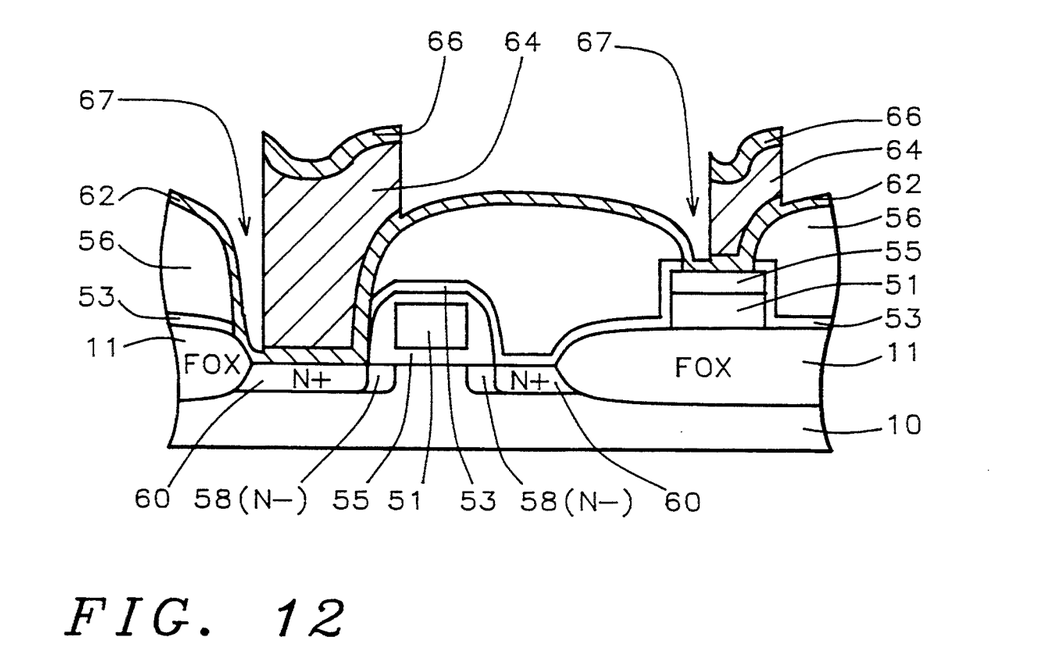

A layer of photoresist is coated over the substrate and patterned to provide a photoresist mask. Referring now to FIG. 11, the antireflective coating, the metal layer, and a portion of the barrier metal layer not covered by the photoresist mask are etched away using a dry etch. The antireflective coating will prevent the metal notching problem of the prior art. FIG. 12 shows the substrate after the photoresist mask has been removed.

Figure 13:
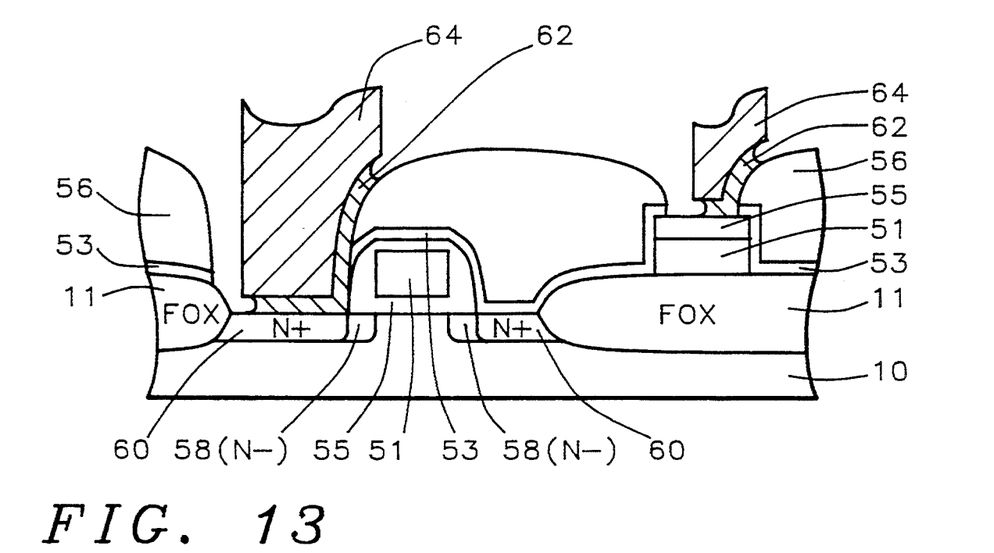

Referring now to FIG. 13, a wet metal etch is used to remove the portion of the barrier metal layer 62 not covered by the metal layer 64. During this wet etch, the remaining antireflective coating 66 is also removed. Because the antireflective coating covers the metal layer 64 and is etched away as the remaining barrier layer 62 is etched away, the metal layer is protected from prolonged exposure to water during the photoresist wet stripping and metal wet etching process. Therefore, the metal notching problem of the prior art, shown in FIG. 5, does not exist here. Since the ARC is completely removed, the problem of conducting pad etch and wire bonding is not an issue. That is, because the antiflective coating is removed in advance, there is no need for an additional dry etch after pad or via etching.

Figure 14:
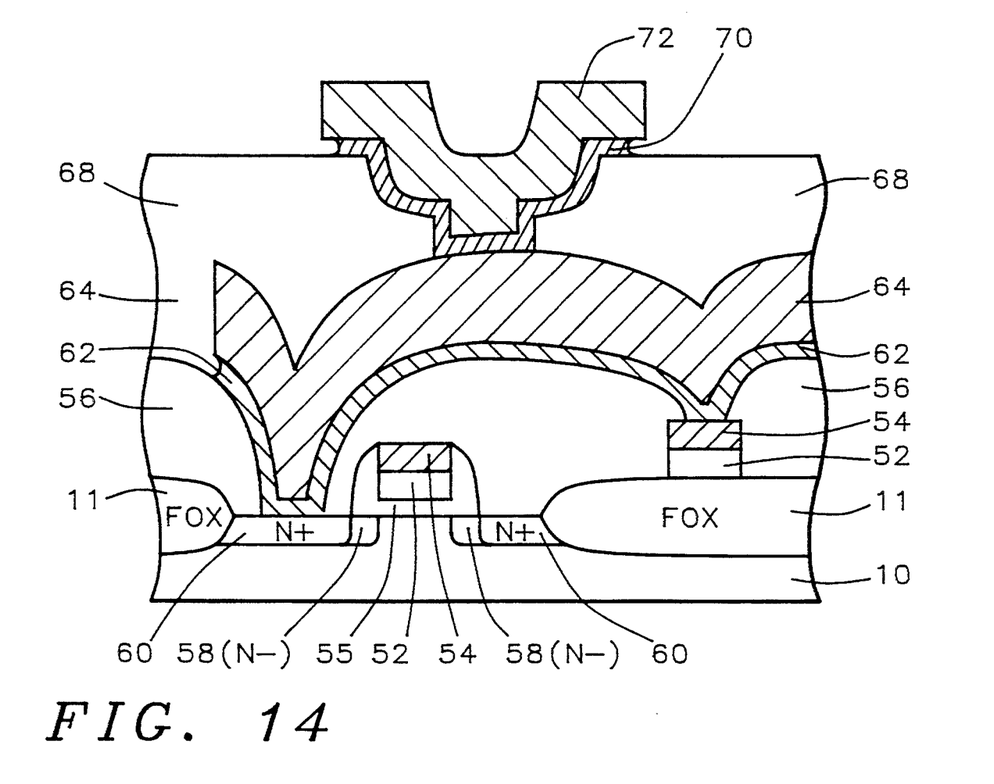
FIG. 14 schematically illustrates in cross-sectional representation a third preferred embodiment of the present invention.

A third embodiment of the present invention is described for a final level of metallization. Referring now to FIG. 14, a partially completed integrated circuit is illustrated as described for FIGS. 6 through 9. First metal layer 64 and barrier metal layer 62 have been patterned and the antireflective coating layer has been removed. A thick insulating layer 68 is blanket deposited over the first metallization. This layer may be composed of borophosphosilicate glass (BPSG), phosphosilicate glass (PSG), silicon dioxide, or the like.

Openings are made through the insulating layer to the first metallization 64 where contacts are to be made. A barrier metal layer 70 is conformally deposited over the insulating layer and within the contact openings. The barrier metal layer may be a single layer of titanium, titanium tungsten or titanium nitride or a first layer of titanium and a second layer of either titanium tungsten or titanium nitride, as above.

Next, a metal layer 72 is sputter deposited over the barrier metal layer. The metal layer is typically aluminum or an aluminum alloy such as AlSi, or AlSiCu.

The key disposable antireflective coating method of the invention is the same as described for the first embodiment. The antireflective coating layer is deposited over the metal layer by sputtering to a thickness of between about 200 to 500 Angstroms. The dry etch as described above, etches away the ARC layer, the metal layer, and a portion of the barrier metal layer not covered by a photoresist mask. The wet etch, as described above, removes the remainder of the barrier metal layer not covered by the metal layer and the remainder of the ARC layer which continues to protect the metal layer from pitting while it is etched away.

The metal etching process of the present invention uses a disposable antireflective coating to prevent metal notching caused by the reflection of light rays during photolithography and to protect the metal layer from pitting during wet chemical etch. The process can be used during metal etching in contacts requiring metal to contact overlap or in self-aligned contacts. It can also be used for the final level metallization.

While the invention has been particularly shown and described with reference to the preferred embodiments thereof, it will be understood by those skilled in the art that various changes in form and details may be made without departing from the spirit and scope of the invention.

What is claimed is:

1. A method of metal patterning in the fabrication of an integrated circuit comprising:
   providing an insulating layer over semiconductor device structures in and on a semiconductor substrate;
   providing openings through said insulating layer to said semiconductor substrate and to said semiconductor device structures to be contacted;
   depositing a barrier metal layer conformally over said insulating layer and within said openings;
   depositing a metal layer over said barrier metal layer;
   covering said metal layer with an antireflective coating other than amorphous silicon or dye resist;
   covering said antireflective coating with photoresist and patterning said photoresist to provide a photoresist mask;
   etching away said antireflective coating, said metal layer and a portion of the thickness of said barrier metal layer where said layers are not covered by said photoresist mask;
   removing said photoresist mask; and
   etching away all remaining said barrier metal layer not covered by said metal layer wherein all remaining said antireflective coating is also removed completing said metal patterning in the fabrication of said integrated circuit.

2. The method of claim 1 wherein said barrier metal layer is composed of titanium with a thickness of between about 1000 to 1400 Angstroms.

3. The method of claim 1 wherein said barrier metal layer is composed of a first layer of titanium with a thickness of between about 300 to 500 Angstroms and a second layer of titanium-tungsten with a thickness of between about 1000 to 1400 Angstroms.

4. The method of claim 1 wherein said barrier metal layer is composed of a first layer of titanium with a thickness of between about 300 to 500 Angstroms and a second layer of titanium nitride with a thickness of between about 1000 to 1400 Angstroms.

5. The method of claim 1 wherein said antireflective coating is composed of titanium nitride with a thickness of between about 200 to 500 Angstroms.

6. The method of claim 1 wherein said antireflective coating is composed of titanium-tungsten with a thickness of between about 200 to 500 Angstroms.

7. The method of claim 1 wherein said antireflective coating is composed of titanium with a thickness of between about 200 to 500 Angstroms.

8. The method of claim 1 wherein said etching away of said antireflective coating, said metal layer and a portion of the thickness of said barrier metal layer is a dry etch.

9. The method of claim 1 wherein said etching away of all remaining said barrier layer not covered by said metal layer and all remaining said antireflective coating is a wet etch comprising $H_2O_2$, $NH_4OH$, and $H_2O$ at room temperature.

10. A method of metal patterning in a self-aligned contact in the fabrication of an integrated circuit comprising:
    providing an insulating layer over semiconductor device structures in and on a semiconductor substrate;
    providing openings through said insulating layer to said semiconductor substrate and to said semiconductor device structures to be contacted;
    depositing a barrier metal layer conformally over said insulating layer and within said openings;
    depositing a metal layer over said barrier metal layer;
    covering said metal layer with an antireflective coating other than amorphous silicon or dye resist;
    covering said antireflective coating with photoresist and patterning said photoresist to provide a photoresist mask;
    etching away said antireflective coating, said metal layer and a portion of the thickness of said barrier metal layer where said layers are not covered by said photoresist mask;
    removing said photoresist mask; and
    etching away all remaining said barrier metal layer not covered by said metal layer wherein all remaining said antireflective coating is also removed completing said metal patterning in a said self-aligned contact in the fabrication of said integrated circuit.

11. The method of claim 10 wherein said barrier metal layer is composed of titanium with a thickness of between about 1000 to 1400 Angstroms.

12. The method of claim 10 wherein said barrier metal layer is composed of a first layer of titanium with a thickness of between about 300 to 500 Angstroms and a second layer of titanium-tungsten with a thickness of between about 1000 to 1400 Angstroms.

13. The method of claim 10 wherein said barrier metal layer is composed of a first layer of titanium with a thickness of between about 300 to 500 Angstroms and a second layer of titanium nitride with a thickness of between about 1000 to 1400 Angstroms.

14. The method of claim 10 wherein said metal layer is composed of one of the group consisting of aluminum, aluminum-silicon, and aluminum-copper-silicon.

15. The method of claim 10 wherein said antireflective coating is composed of titanium nitride with a thickness of between about 200 to 500 Angstroms.

16. The method of claim 10 wherein said antireflective coating is composed of titanium-tungsten with a thickness of between about 200 to 500 Angstroms.

17. The method of claim 10 wherein said antireflective coating is composed of titanium with a thickness of between about 200 to 500 Angstroms.

18. The method of claim 10 wherein said etching away of said antireflective coating, said metal layer and a portion of the thickness of said barrier metal layer is a dry etch.

19. The method of claim 10 wherein said etching away of all remaining said barrier layer not covered by said metal layer and all remaining said antireflective coating is a wet etch comprising $H_2O_2$, $NH_4OH$, and $H_2O$ at room temperature.

20. A method of final level metal patterning in the fabrication of an integrated circuit comprising:

providing semiconductor device structures in and on a semiconductor substrate, an insulating layer overlying said semiconductor device structures, a patterned first metal layer over said insulating layer, and an intermetal dielectric layer over said patterned first metal layer;

providing openings through said intermetal dielectric layer to said patterned first metal layer to be contacted;

depositing a barrier metal layer conformally over said intermetal dielectric layer and within said openings;

depositing a second metal layer over said barrier metal layer;

covering said second metal layer with an antireflective coating other than amorphous silicon or dye resist;

covering said antireflective coating with photoresist and patterning said photoresist to provide a photoresist mask;

etching away said antireflective coating, said second metal layer and a portion of the thickness of said barrier metal layer where said layers are not covered by said photoresist mask;

removing said photoresist mask;

etching away all remaining said barrier metal layer not covered by said second metal layer wherein all remaining said antireflective coating is also removed; and depositing a passivation layer over said patterned second metal layer to complete said final level metal patterning in the fabrication of said integrated circuit.

21. The method of claim 20 wherein said barrier metal layer is composed of one of the group consisting of titanium nitride, titanium-tungsten, titanium, titanium nitride/titanium, and titanium-tungsten/titanium and wherein said layer has a thickness of between about 1000 to 1400 Angstroms.

22. The method of claim 20 wherein said antireflective coating is composed of one of the group consisting of titanium nitride, titanium tungsten, and titanium and wherein said layer has a thickness of between about 200 to 500 Angstroms.

23. The method of claim 20 wherein said etching away of said antireflective coating, said second metal layer and a portion of the thickness of said barrier metal layer is a dry etch.

24. The method of claim 20 wherein said etching away of all remaining said barrier layer not covered by said second metal layer and all remaining said antireflective coating is a wet etch comprising $H_2O_2$, $NH_4OH$, and $H_2O$ at room temperature.

* * * * *